(12) United States Patent
Takahashi et al.

(10) Patent No.: US 11,309,794 B2
(45) Date of Patent: Apr. 19, 2022

(54) SWITCHING POWER SUPPLY DEVICE

(71) Applicant: Hitachi Automotive Systems, Ltd., Hitachinaka (JP)

(72) Inventors: Naoya Takahashi, Hitachinaka (JP); Kenji Kubo, Hitachinaka (JP); Takuma Ono, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 0 days.

(21) Appl. No.: 16/616,606

(22) PCT Filed: Apr. 12, 2018

(86) PCT No.: PCT/JP2018/015328
§ 371 (c)(1),
(2) Date: Nov. 25, 2019

(87) PCT Pub. No.: WO2018/221031
PCT Pub. Date: Dec. 6, 2018

(65) Prior Publication Data
US 2020/0186032 A1 Jun. 11, 2020

(30) Foreign Application Priority Data
May 31, 2017 (JP) .............................. JP2017-107323

(51) Int. Cl.
*H02M 3/157* (2006.01)
*H02M 3/158* (2006.01)
(Continued)

(52) U.S. Cl.
CPC ........... *H02M 3/157* (2013.01); *H02M 3/158* (2013.01); *H02M 3/33569* (2013.01); *H03K 7/08* (2013.01)

(58) Field of Classification Search
CPC .......................................... H02M 3/155–1588
See application file for complete search history.

(56) References Cited

U.S. PATENT DOCUMENTS 7,276,861 B1* 10/2007 Shteynberg ............. G05F 1/618
315/291
2014/0226369 A1* 8/2014 Kimura ............... H02M 3/3376
363/21.09
(Continued)

FOREIGN PATENT DOCUMENTS

JP   2009-95091 A   4/2009
JP   2016-46952 A   4/2016
(Continued)

OTHER PUBLICATIONS

International Search Report (PCT/ISA/210) issued in PCT Application No. PCT/JP2018/015328 dated Jul. 10, 2018 with English translation (two (2) pages).
(Continued)

*Primary Examiner* — Peter M Novak
(74) *Attorney, Agent, or Firm* — Crowell & Moring LLP

(57) ABSTRACT

There is provided a switching power supply device which has a high voltage control resolution. A switching power supply device according to the present invention includes: a power conversion circuit which includes a switching element; and a control circuit unit which outputs a driving pulse to the switching element based on an output voltage command value and an output voltage value of the power conversion circuit, and the control circuit unit changes a switching cycle and outputs a driving pulse based on a difference between a calculation value of an operation amount based on the output voltage command value and the output voltage value, and a setting value of the operation amount.

11 Claims, 8 Drawing Sheets

(51) Int. Cl.
*H02M 3/335* (2006.01)
*H03K 7/08* (2006.01)

(56) References Cited

U.S. PATENT DOCUMENTS

| | | | |
|---|---|---|---|
| 2016/0026205 A1* | 1/2016 | Song | G05F 3/08 |
| | | | 323/313 |
| 2016/0099649 A1 | 4/2016 | Hara et al. | |
| 2017/0012529 A1* | 1/2017 | Yamada | H02M 3/158 |
| 2017/0025947 A1* | 1/2017 | Wang | H02M 3/156 |
| 2017/0047902 A1* | 2/2017 | Wei | H03F 3/2171 |
| 2018/0248465 A1 | 8/2018 | Higashi et al. | |
| 2019/0214916 A1* | 7/2019 | Takahara | H02M 3/33569 |

FOREIGN PATENT DOCUMENTS

| | | |
|---|---|---|
| JP | 2016-163401 A | 9/2016 |
| JP | 2016-178800 A | 10/2016 |
| WO | WO 2014/192290 A1 | 12/2014 |

OTHER PUBLICATIONS

Japanese-language Written Opinion (PCT/ISA/237) issued in PCT Application No. PCT/JP2018/015328 dated Jul. 10, 2018 (three (3) pages).

* cited by examiner

COMPARATIVE EXAMPLE

PRESENT INVENTION

SWITCHING POWER SUPPLY DEVICE

TECHNICAL FIELD

The present invention relates to a switching power supply device.

BACKGROUND ART

In recent years, to meet demands for miniaturization, higher performance and higher functionality of switching power supply devices, a digital control system has been widely adopted in place of a conventional analog control system. The digital control system includes an A/D converter which samples a control target voltage value, a digital controller which calculates an operation amount based on the voltage value, a counter which counts up/down in synchronization with a clock signal, and a comparator which compares a count value of the counter and the operation amount, and determines a (hiving pulse width and a phase of a switching element. For example, according to PWM (Pulse Width Modulation) control, the operation amount is changed to change an ON duty (a time ratio of a logic "H") of a driving pulse outputted by the comparator, and control a control target voltage. In addition, each function is usually included in the digital controller.

This digital control system has a problem that a minimum change range of the operation amount is limited to one cycle of the clock signal, and therefore a voltage control resolution lowers compared to the analog control system. By contrast with this, there may be considered a method for increasing a control resolution by increasing a frequency of a clock signal. However, this method has a problem that the increase of the clock frequency increases consumption power and cost of a controller.

Hence, in Patent Literature the operation amount becomes the continuous value which is not restricted by the clock frequency. Consequently, it is possible to increase the control resolution even when a low-cost digital controller of a low clock frequency is used.

CITATION LIST

Patent Literature

PTL 1: JP 2009-95091 A

SUMMARY OF INVENTION

Technical Problem

However, the method disclosed in Patent Literature 1 needs to newly provide the pulse smoothing circuit, the sawtooth wave generating circuit and the comparator circuit, and therefore has a problem that the number of parts, cost and a mounting area increase. Furthermore, the pulse smoothing circuit performs smoothing, and therefore there is a problem that it slightly delays a control response.

As described above, the switching power supply device of the conventional digital control system has a drawback that at least cost needs to be increased and performance needs to be lowered to increase the control resolution.

The present invention has been made in light of such a situation, and an object of the present invention is to provide a switching power supply device which has a high resolution of voltage control without providing an additional circuit and delaying a control response.

Solution to Problem

A switching power supply device according to the present invention includes: a power conversion circuit which includes a switching element; and a control circuit unit which outputs a driving pulse to the switching element based on an output voltage command value and an output voltage value of the power conversion circuit, and the control circuit unit changes a switching cycle and outputs a driving pulse based on a difference between a calculation value of an operation amount based on the output voltage command value and the output voltage value, and a setting value of the operation amount.

Advantageous Effects of Invention

According to the present invention, a switching power supply device of a digital control system can use a high-performance digital processor, and improve resolutions of PWM control and phase shift control without providing an additional circuit and delaying a response. Consequently, it is possible to provide the switching power supply device which has a high voltage control resolution, is low cost, makes a response at a high speed and causes a little voltage ripple.

DESCRIPTION OF EMBODIMENTS

Hereinafter, a plurality of embodiments according to the present invention will be described with reference to the drawings.

Figure 1:
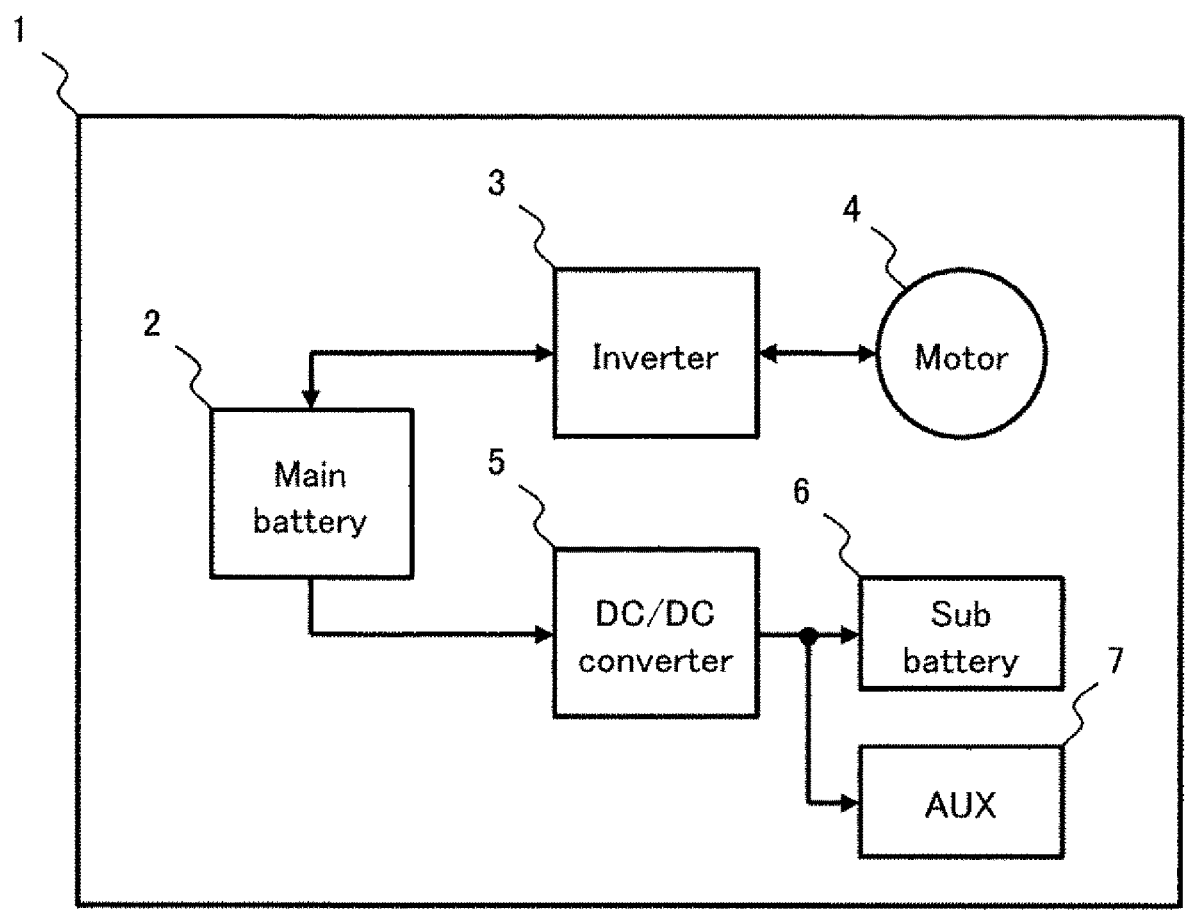
FIG. 1 is a configuration diagram of a power supply system in a vehicle 1 which is typically a hybrid car.

FIG. 1 shows a configuration example of a power supply system in a vehicle 1 which is typically a hybrid car. The vehicle 1 includes a main battery 2, an inverter 3, a motor 4, a DC/DC converter 5, a sub battery 6 and an auxiliary 7. The inverter 3 converts direct current power stored in the main battery 2 into alternating current power to drive the motor 4.

The DC/DC converter 5 converts the direct current power stored in the main battery 2 into a voltage by performing switching control on a semiconductor element to supply to the sub battery 6 and the auxiliary 7. It is preferable to apply the present embodiment to the switching power supply device such as the DC/DC converter 5. A first embodiment and a second embodiment which are application examples to the DC/DC converter 5 will be described.

First Embodiment

The first embodiment of the present invention will be described with reference to FIGS. 2 to 4. The present embodiment improves a voltage control resolution in a case where a non-insulation type buck converter of PWM (Pulse Width Modulation) control is used as a DC/DC converter 5.

Figure 2:
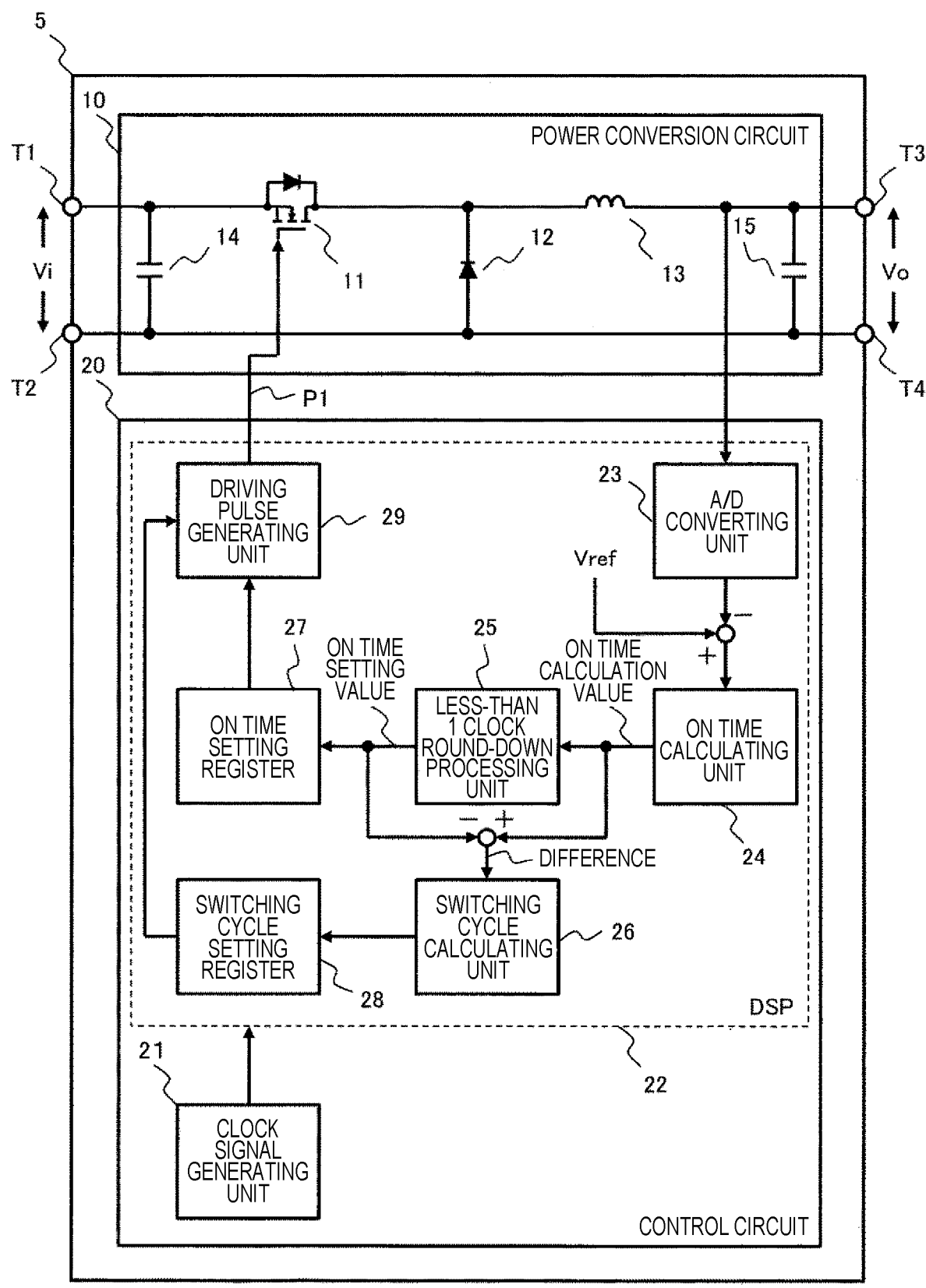
FIG. 2 is a circuit block diagram of a DC/DC converter 5 according to a first embodiment.

FIG. 2 is a circuit block diagram of the DC/DC converter 5 according to the first embodiment. The DC/DC converter 5 illustrated in FIG. 2 includes a power conversion circuit 10 and a control circuit 20.

The power conversion circuit 10 includes a switching element 11, a diode 12, an inductor 13, an input smoothing capacitor 14 and an output smoothing capacitor 15, and converts power by driving the switching element 11 based on a driving pulse P1 outputted by the control circuit 20 by PWM control.

The power conversion circuit 10 is a so-called buck chopper which bucks an input voltage Vi between input terminals T1 and T2, and outputs an output voltage Vo between output terminals T3 and T4. The output voltage of the buck chopper is expressed as Vo=Vi×Don, and Vo can be adjusted by changing Don. In this regard, Don represents an ON duty, i.e., a rate of an on period Ton of a switching element with respect to a switching cycle Tsw, and has a relationship of Don=Ton÷Tsw. According to general PWM control, the switching cycle Tsw is fixed, and Ton is controlled to adjust Vo.

The control circuit 20 includes a clock signal generating unit 21 and a DSP (Digital Signal Processor) 22 which performs calculation in synchronization with a clock signal, and calculates and outputs the appropriate driving pulse P1 such that the output voltage Vo becomes close to a predetermined voltage command value Vref.

The DSP 22 includes an A/D converting unit 23, an ON time calculating unit 24, a less-than 1 clock round-down processing unit 25, a switching cycle calculating unit 26, an ON time setting register 27, a switching cycle setting register 28 and a driving pulse generating unit 29.

The A/D converting unit 23 performs A/D conversion for sampling an analog voltage of the output voltage Vo and converting the analog voltage into a digital value, and outputs a conversion value to the ON time calculating unit 24.

The ON time calculating unit 24 calculates the ON time Ton of the driving pulse P1 which is an operation amount based on a deviation of an A/D conversion value of the output voltage Vo and the output voltage command value Vref. The ON time calculating unit 24 is configured to perform, for example, PI (Proportional Integral) control.

The less-than 1 clock round-down processing unit 25 converts an ON time calculation value into a clock signal cycle unit, and outputs an ON time setting value which is set to the ON time setting register 27.

The switching cycle calculating unit 26 calculates a switching cycle based on a difference between the ON time calculation value and the ON time setting value, and outputs the switching cycle to the switching cycle setting register 28. More specifically, the switching cycle calculating unit 26 is configured to add a change amount ΔT of the switching cycle to a basic switching cycle T, and is configured to determine the change amount ΔT of the switching cycle by multiplying a proportionality factor on the difference to calculate a setting value of the switching cycle.

The ON time setting register 27 and the switching cycle setting register 28 hold the setting value of the ON time and the setting value of the switching cycle, and output the setting value to the driving pulse generating unit 29 per predetermined control cycle Tc.

Although not illustrated, the driving pulse generating unit 29 includes a counter which performs counting up/down in synchronization with a clock signal and resets a count value per predetermined reset cycle, and a comparator which receives an input of and compares a count value of the counter and the operation amount, and thereby outputs a PWM (Pulse Width Modulation) pulse. In the present embodiment, the setting value of the switching cycle setting register 28 is inputted as a reset cycle, and the setting value of the ON time setting register is inputted as the operation amount. The above is the operation and the configuration of the DC/DC converter 5.

Next, an effect of the present embodiment will be described with reference to FIG. 3. FIG. 3 is an explanatory view illustrating a difference between ON duty change ranges according to a comparative example and the first embodiment.

Figures 3A, 3B:
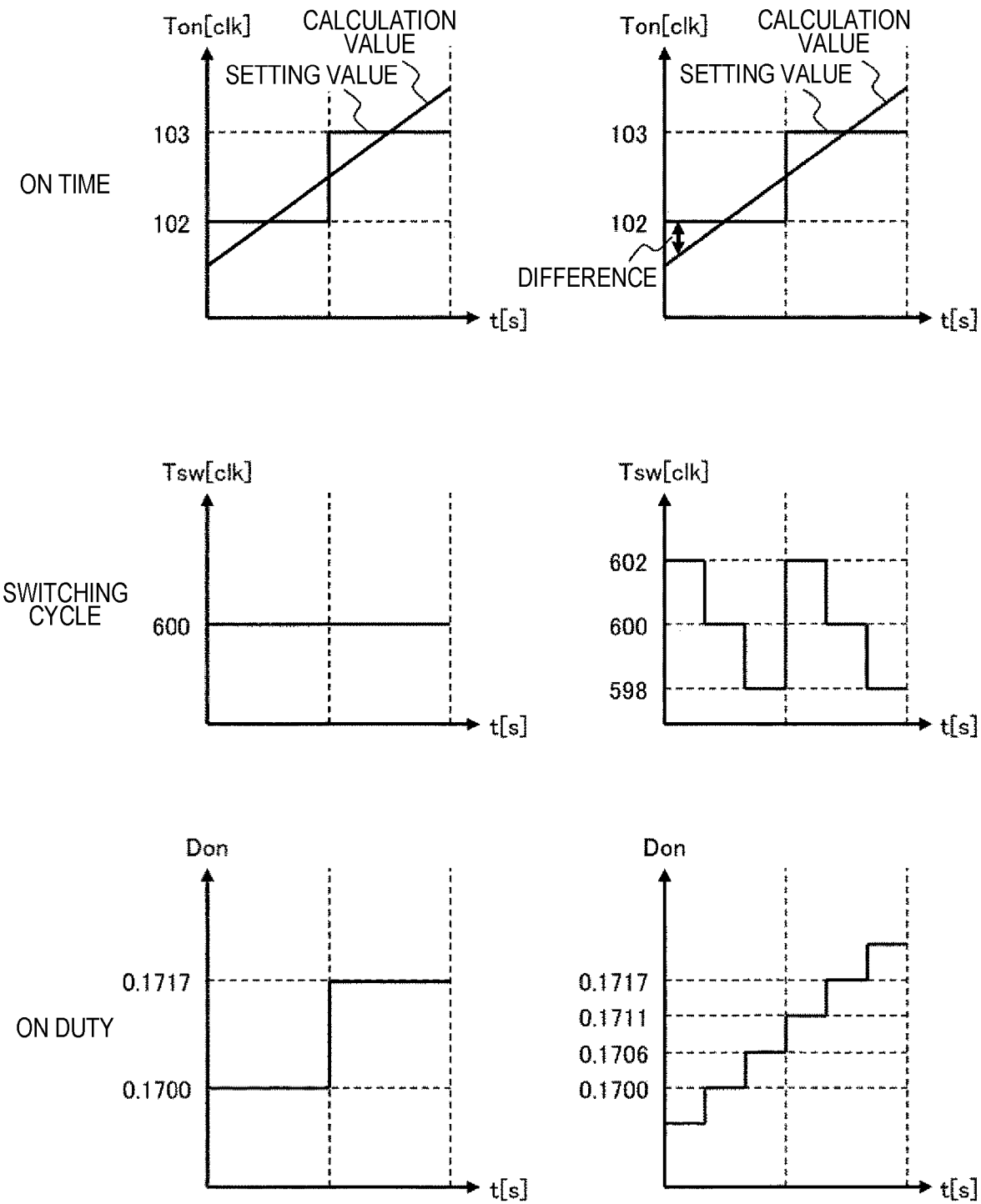
FIGS. 3A and 3B are explanatory views illustrating a difference between ON duty change ranges according to a comparative example and the first embodiment.

The column in FIG. 3(a) illustrates changes of the ON time Ton, the switching cycle Tsw and the ON duty Don in a case where the ON time Ton which is the operation amount is changed by one clock during PWM control of the switching power supply device according to the comparative example.

The column in FIG. 3(b) illustrates changes of the ON time Ton, the switching cycle Tsw and the ON duty Don in a case where the ON time Ton is changed by one clock during PWM control of the switching power supply device according to the present embodiment.

In the column in FIG. 3(a), the switching cycle Tsw is fixed, and therefore a minimum change range of the ON duty Don is determined depending on one clock width of the ON time Ton. By contrast with this, in the column in FIG. 3(b), the switching cycle Tsw is also changed according to a magnitude of a difference between a calculation value and the setting value of the ON time Ton.

Consequently, the ON duty Don is determined based on both of the ON time Ton and the switching cycle Tsw, and a plurality of values of the ON duty Don can be taken for the certain ON time Ton. Consequently, as is clear from comparison with the ON duty Don in FIGS. 3(a) and 3(b), it is finely control the ON duty Don and improve a resolution.

In this regard, the resolution of the ON duty Don is improved in a case where the switching cycle Tsw is changed for specifically the following reason.

First, when a Don change amount is ΔD1 in a case where Ton is changed by one clock, ΔD1=(Ton+1)÷Tsw−Ton÷Tsw=1÷Tsw can be expressed.

On the other hand, when the Don change amount is ΔD2 in a case where Tsw is changed by one clock, $\Delta D2=Ton \div Tsw-Ton \div (Tsw+1)=(Ton \div Tsw) \times 1 \div (Tsw+1)$
can be expressed. In this regard, the switching cycle Tsw is usually sufficiently larger than the one clock, and Tsw>>1 holds, and therefore the Don change amount can be approximated like $\Delta D2 \approx (Ton \div Tsw) \times 1 \div Tsw=Don \times 1 \div Tsw=\Delta D2=Don \times \Delta D1$.

As a result, the change amount of the ON duty Don in a case where the switching cycle Tsw is changed by the one clock is Don times compared to a case where the ON time Ton is changed by the one clock, and the resolution improves by 1÷Don times. In this regard, the ON duty Don is determined based on the input voltage Vi and the output voltage Vo, and therefore the change amount of an optimal switching cycle to improve the resolution changes according to an input/output voltage condition.

Figure 4:
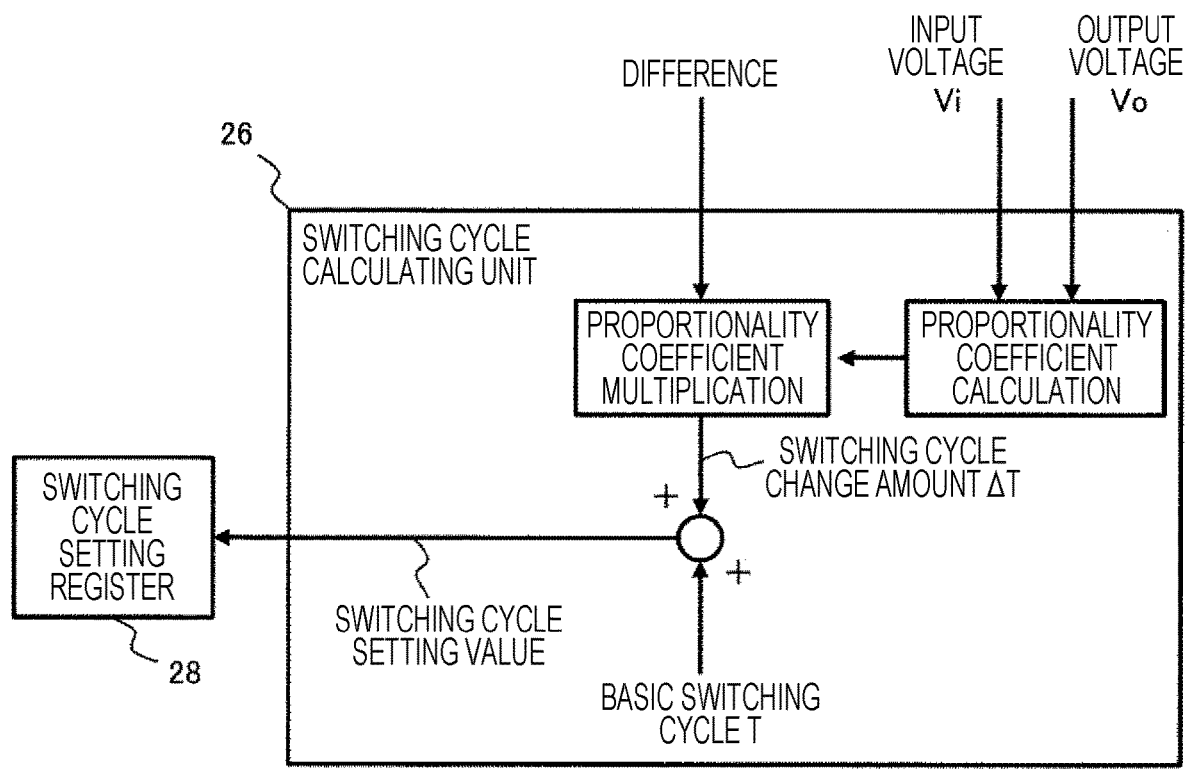
FIG. 4 is a detailed block circuit diagram of a switching cycle calculating unit 26 according to the present embodiment.

Hence, the switching cycle calculating unit 26 may employ, for example, a configuration illustrated in FIG. 4. FIG. 4 is a detailed block circuit diagram of a switching cycle calculating unit 26 according to the present embodiment. In FIG. 4, the switching cycle calculating unit 26 calculates the proportionality factor based on the input voltage Vi and the output voltage Vo, and determines a switching cycle setting value as the change amount of the switching cycle obtained by multiplying the proportionality factor on the difference. Consequently, it is possible to improve a resolution irrespectively of the input/output voltage condition.

As described above, according to the first embodiment, by changing the switching cycle Tsw based on the difference between the difference between the operation amount and the setting value of the ON time Ton, it is possible to finely control the ON duty Don.

Second Embodiment

The second embodiment of the present invention will be described with reference to FIGS. 5 to 7. The present embodiment improves a voltage control resolution in a case where an insulation type buck converter of a phase shift control system is used as a DC/DC converter 5. A configuration and an operation of the DC/DC converter 5 to which the present embodiment is applied will be described with reference to FIG. 5.

Figure 5:
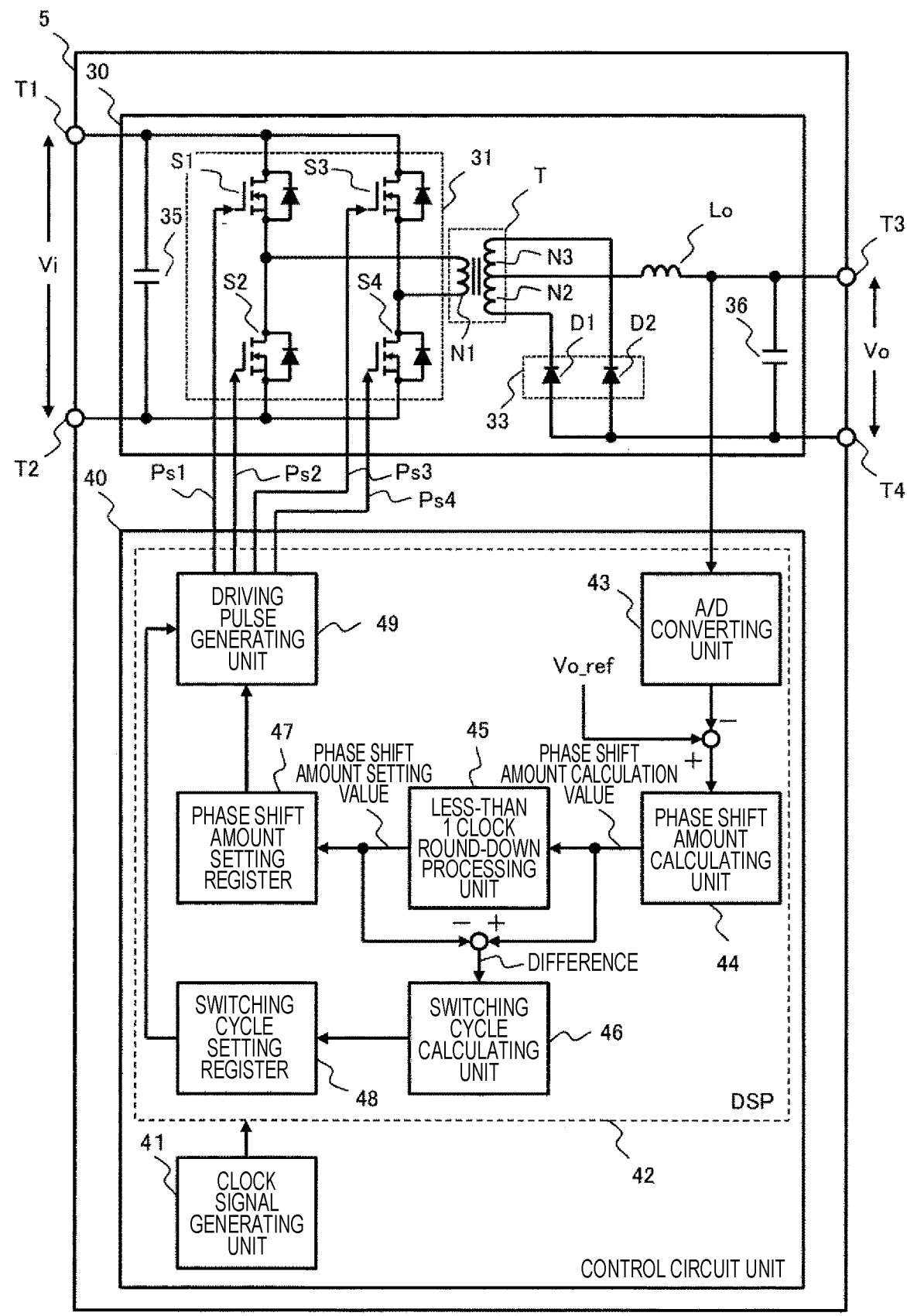
FIG. 5 is a circuit block diagram of the DC/DC converter 5 according to a second embodiment.

The DC/DC converter 5 illustrated in FIG. 5 includes a power conversion circuit 30 and a control circuit 40. An ON time of an operation amount of a control circuit 20 in FIG. 2 is only changed to a phase shift amount, and therefore the control circuit 30 will not be described in detail.

First, a configuration of the power conversion circuit will be described. The power conversion circuit 30 includes a transformer T which includes a primary winding N1, a secondary winding N2 and a secondary winding N3 (N2 coil turn=N3 coil turn), a switching circuit 31 which includes switching elements S1 to S4, a rectifier circuit 32 which includes diodes D1 and D2, a smoothing inductor Lo, an input smoothing capacitor 35, and an output smoothing capacitor 36.

The switching circuit 31 includes a first switching leg which is formed by connecting the switching elements S1 and S2 in series, and a second switching leg which is formed by connecting the switching elements S3 and S4 in series.

The switching circuit 31 employs a full-bridge configuration where a portion between both ends of the first switching leg and the second switching leg is connected with a portion between both ends of the input smoothing capacitor 35, and a series connection point of the switching elements S1 and S2 and a series connection point of the switching elements S3 and S4 are connected with a portion between both ends of a primary winding of the transformer T. In addition, MOSFETs are used as the switching elements S1 to S4 in FIG. 5. However, other semiconductor elements such as IGBTs may be used.

Next, an operation of the power conversion circuit 30 will be described. First, by alternately repeating an operation of simultaneously switching S1 and S4 of the switching elements S1 to S4 to ON and simultaneously switching a pair of S2 and S3 to ON, the switching circuit 31 generates a square wave alternating current voltage from a direct current voltage of the input smoothing capacitor 35.

The ON duties of driving pulses Ps1 to Ps4 of the switching elements S1 to S4 are basically 50%, and the switching elements S1 and S2 are switched in a complementary manner and S3 and S4 are switched in a complementary manner. Furthermore, a phase difference between a driving pulse of the first switching leg and a driving pulse of the second switching leg is changed to change a duration of a simultaneous ON period of the switching elements S1 and S4 and a simultaneous ON period of S2 and S3. Thus, a voltage application time ratio on a positive side and a negative side of a square alternating current voltage is adjusted.

The square wave alternating current voltage generated by the switching circuit 31 is inputted between the both ends of the primary winding N1 of the transformer, and causes the alternating current to flow to the primary winding N1. The alternating current flowing to the primary winding causes an alternating current induced current to flow to the secondary windings N2 and N3. The alternating current induced current is rectified by the rectifier circuit 32, and a direct current voltage smoothed by the smoothing inductor Lo and the output smoothing capacitor 36 is outputted.

Figure 6:
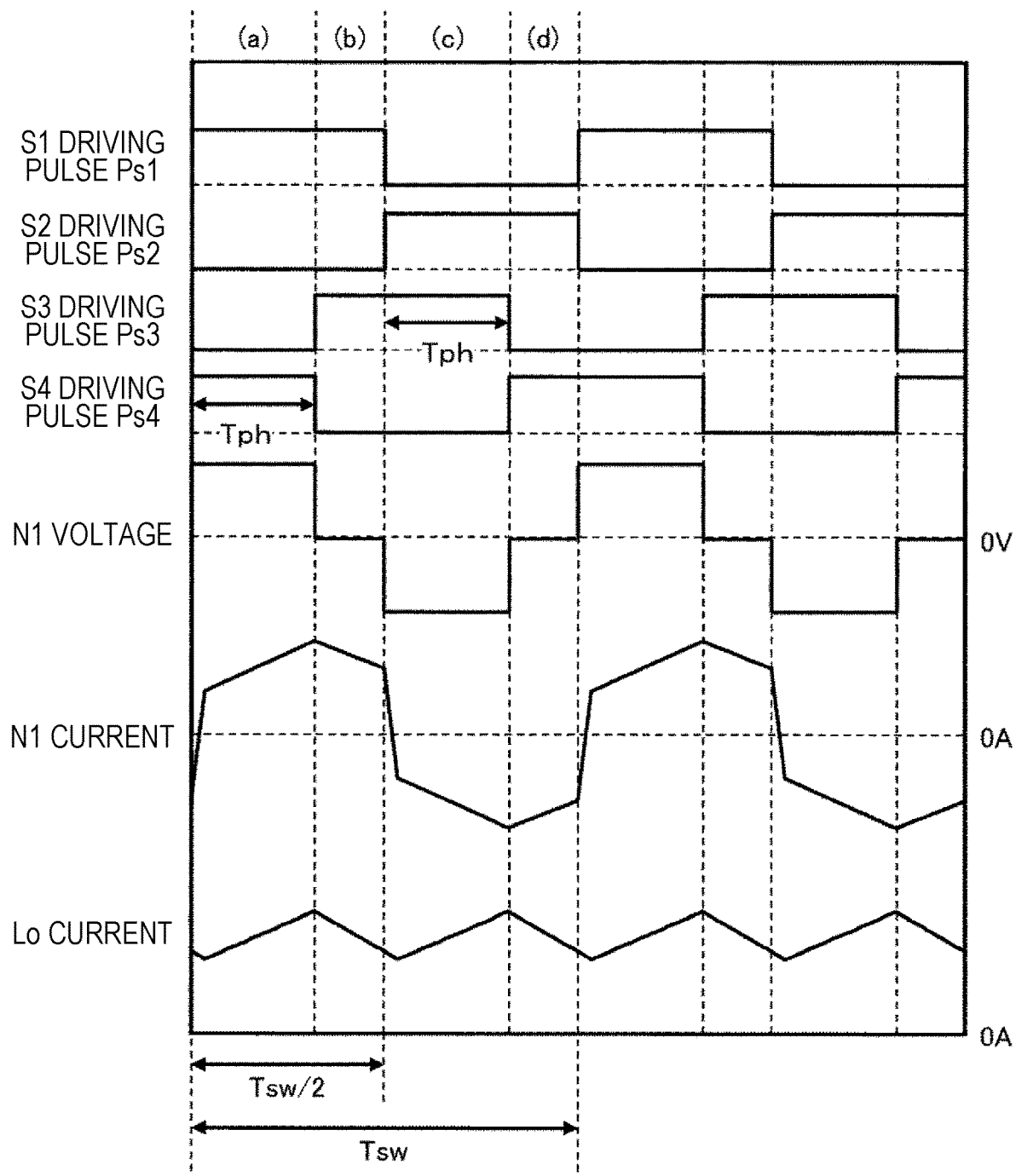
FIG. 6 illustrates ON/OFF states of driving pulses Ps1 to Ps4 of switching elements S1 to S4, an output voltage (=N1 voltage) of a switching circuit 31, a current of a primary winding N1, and a waveform of a current of a smoothing inductor Lo according to the second embodiment.
Figure 7A:
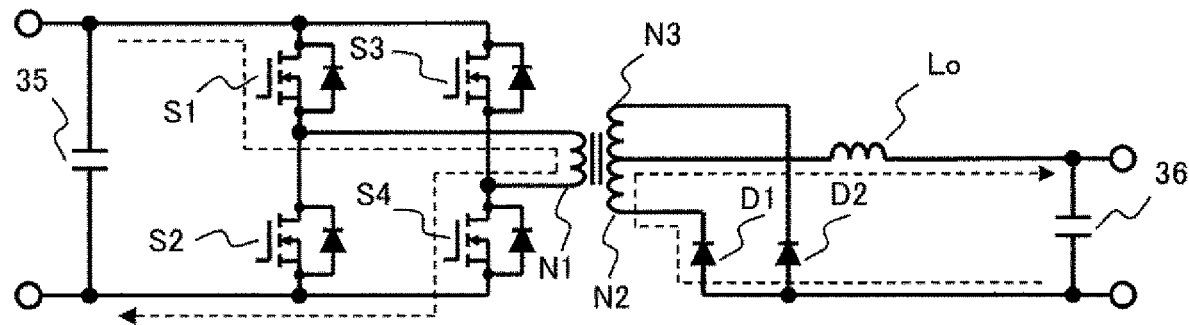
FIG. 7A is a flowchart of a current route of a power conversion circuit 30 corresponding to a period (a) in FIG. 6.
Figure 7B:
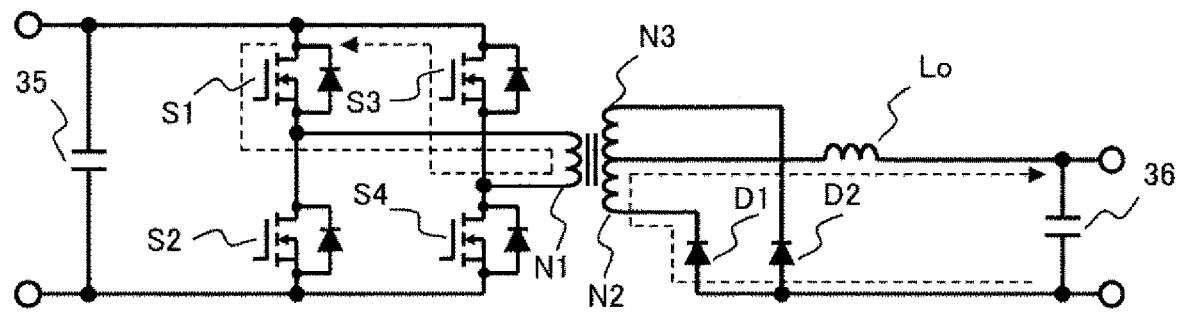
FIG. 7B is a flowchart of the current route of the power conversion circuit 30 corresponding to a period (b) in FIG. 6.
Figure 7C:
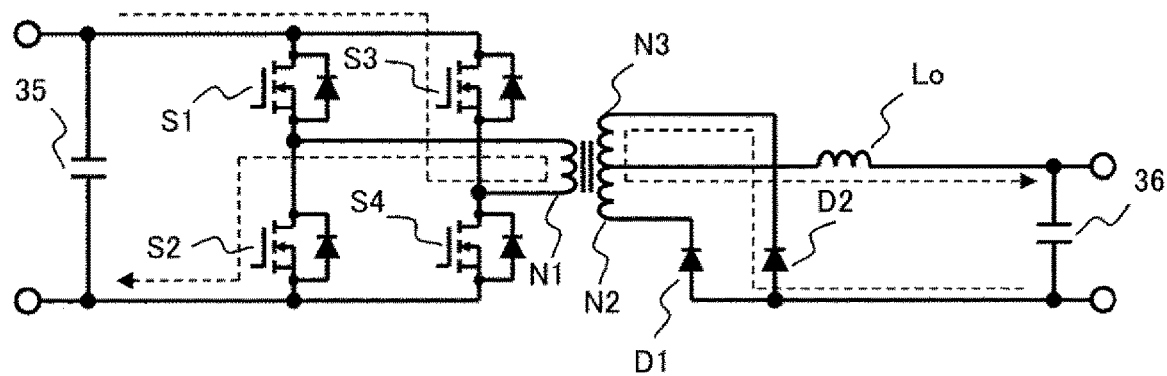
FIG. 7C is a flowchart of the current route of the power conversion circuit 30 corresponding to a period (c) in FIG. 6.
Figure 7D:
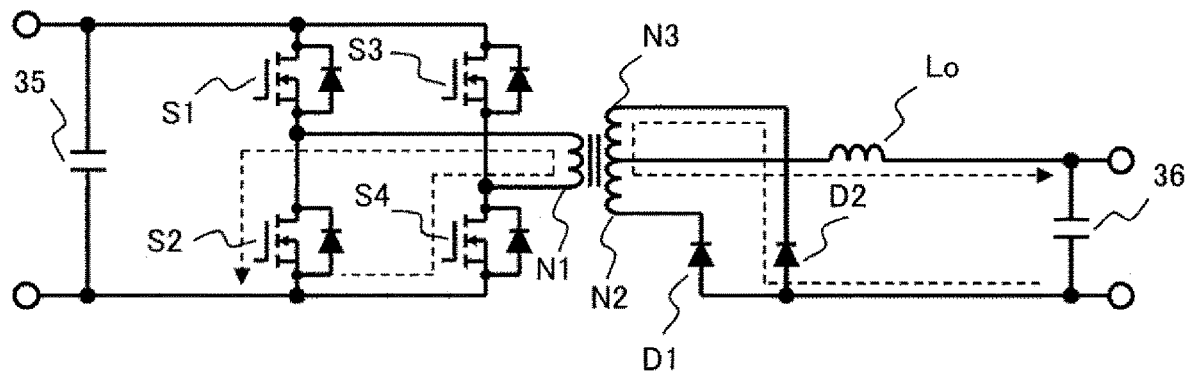
FIG. 7D is a flowchart of the current route of the power conversion circuit 30 corresponding to a period (d) in FIG. 6.

The above operation is illustrated in FIGS. 6 and 7. FIG. 6 illustrates ON/OFF states of the driving pulses Ps1 to Ps4 of the switching elements S1 to S4, an output voltage (=N1 voltage) of the switching circuit 31, the current of the primary winding N1, and the waveform of the current of the smoothing inductor Lo. In addition, dead times are preferably provided between an S1 driving pulse Ps1 and an S2 driving pulse Ps2 and between an S3 driving pulse Ps3 and an S4 driving pulse Ps4, yet are omitted herein. FIGS. 7(*a*) to 7(*d*) illustrate current routes of the power conversion circuit 30, and current routes (a) to (d) in FIG. 7 correspond to periods (a) to (d) in FIG. 6. An operation in the periods (a) to (d) is as follows.

In the period (a), S1 and S4 are switched to ON, and a positive voltage is applied to N1. The current flows in a route of S1, N1 and S4 on the primary side, and in a route of D1, N21 and Lo on the secondary side, and increases.

In the period (b), S4 is switched to off from a state in (a), and S3 is switched to on. The route of the current flowing in S4 is blocked on the primary side, and therefore the voltage is not applied to N1. Energy accumulated in an unillustrated leakage inductance Lr of the transformer T circulates passing S1 and S3 and is discharged. The current on the primary side flows in a route of S1, N1 and S3, and decreases. The current decreases on the secondary side, too, since the energy accumulated in Lo is discharged.

In the period (c), S1 is switched to off from a state in (b), and S2 is switched to on. S2 and S3 are switched to on, and a negative voltage is applied to N1. The current flows in a route of S3, N1 and S2 on the primary side, and in a route of D2, N3 and Lo on the secondary side, and increases.

In the period (d), S3 is switched to off from a state in (c), and S4 is switched to on. The route of the current flowing in S2 is blocked on the primary side, and therefore the voltage is not applied to N1. The energy accumulated in the leakage inductance Lr of the transformer T circulates passing S2 and S4 and is discharged. The current on the primary side flows in a route of S4, N1 and S2, and decreases. The current decreases on the secondary side, too, since the energy accumulated in L is discharged.

After the period (d), S3 is switched to off and S1 is switched to on, and the period returns to (a) to repeat the operation in the periods (a) to (d).

As described above, the power conversion circuit 30 of the DC/DC converter 5 according to the present embodiment controls an output voltage Vo by changing a phase shift amount Tps corresponding to the phase difference between the driving pulses of the first switching leg and the second switching leg. In this regard, when a ratio of a half cycle of the phase shift amount and a switching cycle Tsw is defined as a phase shift duty Dps, $Dps=Tps \div (Tsw \div 2)$ holds, and the relationship between the output voltage Vo and the phase shift amount Tps can be expressed as $Vo=N \times Vi \times Dps=N \times Vi \times Tps \div (Tsw \div 2)$. Consequently, similar to the first embodiment, by changing the phase shift amount Tps which is the operation amount and, in addition, the switching cycle Tsw, it is possible to improve a resolution of the phase shift duty Dps and increase an output voltage control resolution.

In addition, when the transformer T is provided as in the present embodiment, periods on the positive side and the negative side of the square wave alternating current voltage to be inputted to the transformer T are preferably made equal to prevent a bias magnetization phenomenon of the transformer T. By the way, when the switching cycle is set to odd-numbered clocks, a difference is produced between the periods on the positive side and the negative side of the square wave alternating current voltage. When, for example, the switching cycle Tsw is 601 clocks, and the ON duty of the driving pulse is 50%, and driving is performed in a complementary manner similar to the switching elements S1 and S2, the one ON time is 300 clocks and the other ON time is 301 clocks. As a result, a difference is produced between the periods on the positive side and the negative side of the square wave alternating current voltage to be inputted to the transformer T. Hence, it is preferable that, when the transformer T is provided, the basic switching cycle is even-numbered clocks, and the switching cycle calculating unit in FIG. 5 restricts the change amount of the switching cycle Tsw to even-numbered clocks such that the switching cycle is the even-numbered clocks.

CONCLUSION

As described above, according to the first and second embodiments of the present invention, a switching power supply device of the digital control system can finely control an ON duty Don by changing the switching cycle Tsw based on the difference between a calculation value and a setting value of the operation amount. As a result, it is possible to provide the switching power supply device which has a high voltage control resolution, and causes a little voltage ripple. Furthermore, the present invention does not need to additionally include a circuit to improve the control resolution, and consequently can contribute to the small and low-cost switching power supply device. In addition, the first and second embodiments have described examples of the switching power supply device which is mounted on a vehicle, yet are applicable to any switching power supply device, too, which is not limited to the vehicles. Furthermore, the operation amount is not limited to the on time and the phase shift amount described in the present embodiment. As long as the operation amount can improve a control target resolution in combination with a change of the switching cycle Tsw, the present invention is applicable thereto. Furthermore, the power conversion circuit is not limited to a buck chopper, and a buck converter of the phase shift system, and is applicable to any circuit system such as boost choppers, bidirectional boost/buck choppers, boost converters of a phase shift system, other flyback converters and forward converters. A control unit is not limited to a DSP, and may be replaced with other digital control units such as microcomputers.

REFERENCE SIGNS LIST 1 vehicle
2 main battery
3 inverter
4 motor
5 DC/DC converter
6 sub battery
7 auxiliary
10 power conversion circuit
11 switching element
12 diode
13 inductor
14 input smoothing capacitor
15 output smoothing capacitor
20 control circuit
21 clock signal generating unit
22 DSP (Digital Signal Processor)
23 A/D converting unit
24 ON time calculating unit
25 less-than 1 clock round-down processing unit
26 switching cycle calculating unit
27 ON time setting register
28 switching cycle setting register
29 driving pulse generating unit
30 power conversion circuit
31 switching circuit
35 input smoothing capacitor
36 output smoothing capacitor
40 control circuit
D1 diode
D2 diode
S1 switching element
S2 switching element
S3 switching element
S4 switching element
T transducer
Lo smoothing inductor
N1 primary winding
N2 secondary winding
N3 secondary winding

The invention claimed is:

1. A switching power supply device comprising:
a power conversion circuit which includes a switching element; and
a control circuit unit which outputs a driving pulse to the switching element based on an output voltage command value of the power conversion circuit and an output voltage value of the power conversion circuit, wherein
the control circuit unit is configured to:
calculate a calculation value of a manipulated variable based on an output voltage command value and the output voltage value, calculate a setting value of the manipulated variable which is converted from the calculation value of the manipulated variable into a clock signal cycle unit, decrease a switching cycle of the switching element when the setting value of the manipulated variable is less than the calculation value of the manipulated variable, and increase the switching cycle of the switching element when the setting value of the manipulated variable is greater than the calculation value of the manipulated variable.

2. The switching power supply device according to claim 1, wherein an on time of the driving pulse is an operation amount.

3. The switching power supply device according to claim 2, wherein the control circuit unit includes a unit which generates a clock signal, and the setting value is a multiple of a natural number of a clock cycle.

4. The switching power supply device according to claim 2, wherein the control circuit unit makes a change amount of the switching cycle proportional to the difference.

5. The switching power supply device according to claim 4, wherein the control circuit unit includes a unit which detects an input voltage and/or an output voltage of the power conversion circuit, and changes a proportionality factor which determines the change amount of the switching cycle based on the input voltage and/or the output voltage.

6. The switching power supply device according to claim 2, wherein the power conversion circuit and the control circuit unit includes a unit which generates a clock signal, and calculates a change amount of the switching cycle such that the switching cycle is an even-numbered clock.

7. The switching power supply device according to claim 1, wherein the power conversion circuit includes a first switching leg which is formed by connecting a first switching element and a second switching element in series, and a second switching leg which is formed by connecting a third switching element and a fourth switching element in series, and is a full-bridge circuit in which a portion between both ends of the first switching leg and the second switching leg is a portion between direct current terminals, and a portion between a series connection point of the first switching element and the second switching element, and a series connection point of the third switching element and the fourth switching element is a portion between alternating current terminals, and a phase difference between the driving pulse for the first switching leg and the driving pulse for the second switching leg is an operation amount.

8. The switching power supply device according to claim 7, wherein the control circuit unit includes a unit which generates a clock signal, and the setting value is a multiple of a natural number of a clock cycle.

9. The switching power supply device according to claim 7, wherein the power conversion circuit and the control circuit unit includes a unit which generates a clock signal, and calculates a change amount of the switching cycle such that the switching cycle is an even-numbered clock.

10. The switching power supply device according to claim 7, wherein the control circuit unit makes a change amount of the switching cycle proportional to the difference.

11. The switching power supply device according to claim 10, wherein the control circuit unit includes a unit which detects an input voltage and/or an output voltage of the power conversion circuit, and changes a proportionality factor which determines the change amount of the switching cycle based on the input voltage and/or the output voltage.

* * * * *